US010824786B1

United States Patent
Liu et al.

(10) Patent No.: US 10,824,786 B1
(45) Date of Patent: Nov. 3, 2020

(54) EXTEND ROUTING RANGE FOR PARTIAL RECONFIGURATION

(71) Applicant: Xilinx, Inc., San Jose, CA (US)

(72) Inventors: Jun Liu, San Jose, CA (US); Hao Yu, Longmont, CO (US); Raymond Kong, San Jose, CA (US); David P. Schultz, Longmont, CO (US)

(73) Assignee: XILINX, INC., San Jose, CA (US)

( * ) Notice: Subject to any disclaimer, the term of this patent is extended or adjusted under 35 U.S.C. 154(b) by 531 days.

(21) Appl. No.: 15/285,786

(22) Filed: Oct. 5, 2016

(51) Int. Cl.
  *G06F 17/50* (2006.01)
  *G06F 30/394* (2020.01)
  *G06F 30/34* (2020.01)
  *G06F 30/327* (2020.01)
  *G06F 30/392* (2020.01)
  *G06F 30/347* (2020.01)

(52) U.S. Cl.
  CPC .......... *G06F 30/394* (2020.01); *G06F 30/327* (2020.01); *G06F 30/34* (2020.01); *G06F 30/347* (2020.01); *G06F 30/392* (2020.01)

(58) Field of Classification Search
  None
  See application file for complete search history.

(56) References Cited

U.S. PATENT DOCUMENTS

| | | |
|---|---|---|
| 5,646,564 A | 7/1997 | Erickson et al. |
| 5,815,016 A | 9/1998 | Erickson |
| 6,091,263 A | 7/2000 | New et al. |
| 6,150,839 A | 11/2000 | New et al. |
| 6,204,687 B1 | 3/2001 | Schultz et al. |
| 6,462,579 B1 | 10/2002 | Camilleri et al. |
| 6,526,557 B1 | 2/2003 | Young et al. |
| 6,678,646 B1 * | 1/2004 | McConnell ......... G06F 17/5054 703/22 |
| 6,759,869 B1 | 7/2004 | Young et al. |
| 6,810,514 B1 | 10/2004 | Alfke et al. |
| 6,836,842 B1 | 12/2004 | Guccione et al. |
| 6,907,595 B2 | 6/2005 | Curd et al. |
| 7,024,651 B1 | 4/2006 | Camilleri et al. |
| 7,057,413 B1 | 6/2006 | Young et al. |
| 7,124,338 B1 | 10/2006 | Mark et al. |
| 7,302,625 B1 | 4/2007 | Payakapan et al. |
| 7,224,184 B1 | 5/2007 | Levi et al. |
| 7,477,072 B1 | 1/2009 | Kao et al. |
| 7,478,357 B1 | 1/2009 | Mason et al. |

(Continued)

OTHER PUBLICATIONS

B. Al Farisi et al., "A novel tool flow for increased routing configuration similarity in multi-mode circuits," 2013 IEEE Computer SOciety Annual Symposium on VLSI, pp. 96-101.*

(Continued)

*Primary Examiner* — Leigh M Garbowski
(74) *Attorney, Agent, or Firm* — Patterson + Sheridan, LLP

(57) ABSTRACT

Method, apparatus and computer-readable medium for providing a partial reconfiguration of a reconfigurable module are described. In one example, a method reads a netlist for a design of a circuit comprising a reconfigurable module and sets the reconfigurable module to a first region. The method then generates a second region that encompasses the first region and places the design with the first region. The method routes the design with the second region and generates a partial bitstream for the reconfigurable module.

20 Claims, 6 Drawing Sheets

(56) References Cited

U.S. PATENT DOCUMENTS

| | | | |
|---|---|---|---|
| 7,482,836 B2 | 1/2009 | Levi et al. | |
| 7,509,617 B1 | 3/2009 | Young | |
| 7,516,437 B1 | 4/2009 | Kannan et al. | |
| 7,518,396 B1 | 4/2009 | Kondapalli et al. | |
| 7,546,572 B1 | 6/2009 | Ballagh et al. | |
| 7,600,210 B1* | 10/2009 | Mason | G06F 17/5068 716/138 |
| 7,619,442 B1 | 11/2009 | Mason et al. | |
| 7,640,526 B1* | 12/2009 | Blodget | G06F 17/5054 703/22 |
| 7,640,527 B1 | 12/2009 | Dorairaj et al. | |
| 7,673,272 B1* | 3/2010 | Young | G06F 17/5036 716/138 |
| 7,703,085 B2* | 4/2010 | Poznanovic | G06F 17/5045 717/140 |
| 7,724,815 B1 | 5/2010 | Raha et al. | |
| 7,746,099 B1 | 6/2010 | Chan et al. | |
| 7,902,866 B1* | 3/2011 | Patterson | G06F 17/5054 326/38 |
| 8,102,188 B1 | 1/2012 | Chan et al. | |
| 8,359,448 B1 | 1/2013 | Neuendorffer | |
| 8,368,423 B2* | 2/2013 | Yancey | G06F 15/7867 326/38 |
| 8,402,409 B1* | 3/2013 | Janneck | G06F 17/5054 716/103 |
| 8,415,974 B1 | 4/2013 | Lysaght | |
| 8,554,972 B2* | 10/2013 | Koch | G06F 15/7867 710/100 |
| 8,671,377 B2* | 3/2014 | Goldman | G06F 17/5054 326/37 |
| 8,719,750 B1 | 5/2014 | Balzli, Jr. | |
| 8,928,351 B1 | 1/2015 | Konduru | |
| 9,361,421 B2* | 6/2016 | Goldman | G06F 17/5054 |
| 9,929,734 B2* | 3/2018 | Mertens | H03K 19/17756 |
| 2016/0267212 A1* | 9/2016 | Goldman | G06F 17/5054 |

OTHER PUBLICATIONS

R. Ferreira et al., "A Run-Time Graph-Based Polynomial Placement and Routing Algorithm for Virtual FPGAs," 2013 IEEE, 8 pages.*

T. Friedrich et al., "A Flexible Co-Processing Approach for SoC-FPGAs based on Dynamic Partial Reconfiguration and Bitstream Relocation Methods," 2015 IEEE, 7 pages.*

B.L. Hutchings et al., "Rapid Post-Map Insertion of Embedded Logic Analyzers for Xilinx FPGAs," 2014 IEEE 22$^{nd}$ Annual Int'l Symposium on Field-Programmable Custom Computing Machines, pp. 72-79.*

K. Kepa et al., "ERDB: An Embedded Routing Database for Reconfigurable Systems," 2011 21$^{st}$ Int'l Conference on Field Programmable Logic and Applications, pp. 195-200.D.*

S. Raaijmakers et al., "Run-Time Partial Reconfiguration for Removal, Placmenet and Routing on the Virtex-II Pro," 2007 Ieee, pp. 679-683.*

Kock et al., "Routing Optimizations for Component-based System Design and Partial Run-time Reconfiguration of FPGAs," 2010 IEEE, pp. 460-464.*

E. Vansteenkiste et al., "TPaR: Place and Route Tools for the Dynamic Reconfiguration of the FPGA's Interconnect Network," IEEE Trans. on CAD of ICs and Systems, vol. 33, No. 3, Mar. 2014, pp. 370-383.*

Specification and drawings for U.S. Appl. No. 14/867,461, filed Sep. 28, 2015, Schultz et al.

* cited by examiner

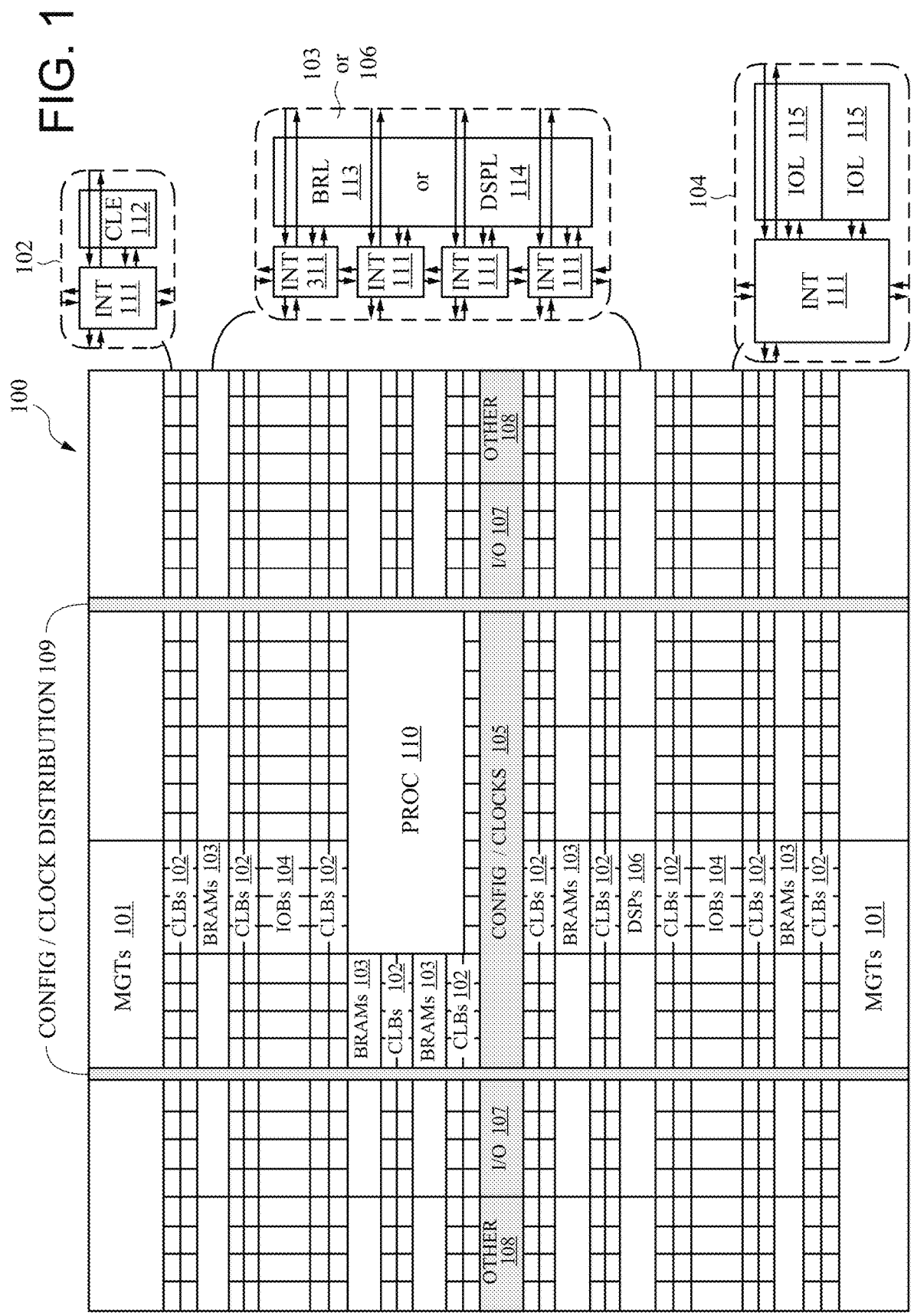

FIG. 2

| | | | | | | | | | | | | | | |
|---|---|---|---|---|---|---|---|---|---|---|---|---|---|---|
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |

FIG. 4

| | | | | | | | | | | | | | | |
|---|---|---|---|---|---|---|---|---|---|---|---|---|---|---|
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |
| P | R | P | P | R | P | P | R | P | P | R | P | P | R | P |

EXTEND ROUTING RANGE FOR PARTIAL RECONFIGURATION

TECHNICAL FIELD

One or more aspects of the present disclosure relate generally to electronic circuit design systems and, more particularly, to a design tool for providing dynamic partial reconfiguration of a circuit design.

BACKGROUND

Programmable logic devices (PLDs) exist as a type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (also known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Presently, a final logic design (referenced herein as the top-level design) for a PLD may include many logic pieces (referenced herein as modules). All of the logic pieces may be implemented at one time to form a full implementation for the target PLD. Alternatively, each module may be designed and implemented separately. Implemented modules are then combined to form a full implementation for the target PLD. Some PLDs are configured to support dynamic reconfiguration while active. That is, some PLDs have the ability to reprogram a portion of the PLD while the rest of the PLD continues to operate normally.

Thus, some module instances of the design for the circuit can be reconfigured with a new function without interrupting the rest of the design. For example, the design module instances that are to be reconfigured are referred as "reconfigurable modules" (RMs), whereas the part of the design that remains unchanged is referred as "static logic" or "static logic module." In order to keep the static logic and other reconfigurable modules undisturbed during the partial reconfiguration of a specific reconfigurable module, a physical device region is specified for each reconfigurable module. Since each reconfigurable module region must not intersect with any other reconfigurable module regions, during partial reconfiguration of a specific reconfigurable module, only its corresponding reconfigurable module region of the device is reprogrammed.

Routing congestions tend to manifest along the boundaries and especially at the corners of a reconfigurable module region, due to the reduction of adjacent routing resources. This may result in a design failing to route certain nets and/or failing to meet timing requirements. Similarly, gaps in physical regions of a given reconfigurable module may also pose challenges in routing since reconfigurable module logic are restricted to use routing resources only in the specified but disjointed regions of the reconfigurable module. Again, undesired results may result, e.g., nets do not route efficiently, clock skew, and/or nets do not meet timing requirements.

SUMMARY

Method, apparatus and computer-readable medium for providing a partial reconfiguration of a reconfigurable module are described. In one example, a method reads a netlist for a design of a circuit comprising a reconfigurable module and sets the reconfigurable module to a first region. The method then generates a second region that encompasses the first region and places the design with the first region. The method routes the design with the second region and generates a partial bitstream for the reconfigurable module.

In another example, a system may comprise a processor and a computer-readable medium storing instructions which, when executed by the processor, cause the processor to perform various operations. The operations may comprise: reading a netlist for a design of a circuit comprising a reconfigurable module, setting the reconfigurable module to a first region, generating a second region that encompasses the first region, placing the design with the first region, routing the design with the second region, and generating a partial bitstream for the reconfigurable module.

In another example, a non-transitory computer-readable medium storing instructions which, when executed by a processor, cause the processor to perform various operations is disclosed. The operations may comprise: reading a netlist for a design of a circuit comprising a reconfigurable module, setting the reconfigurable module to a first region, generating a second region that encompasses the first region, placing the design with the first region, routing the design with the second region, and generating a partial bitstream for the reconfigurable module.

BRIEF DESCRIPTION OF THE DRAWINGS

Accompanying drawing(s) show example example(s) in accordance with one or more aspects of the present disclosure; however, the accompanying drawing(s) should not be taken to limit the present disclosure to the example(s) shown, but are for explanation and understanding only.

FIG. 1 is an illustrative example of an FPGA architecture;

FIG. 2 is an illustrative block diagram depicting an illustrative example of an FPGA partial reconfiguration architecture;

FIG. 4 is an illustrative block diagram depicting another illustrative example of an FPGA partial reconfiguration architecture;

DETAILED DESCRIPTION

Figure 3:
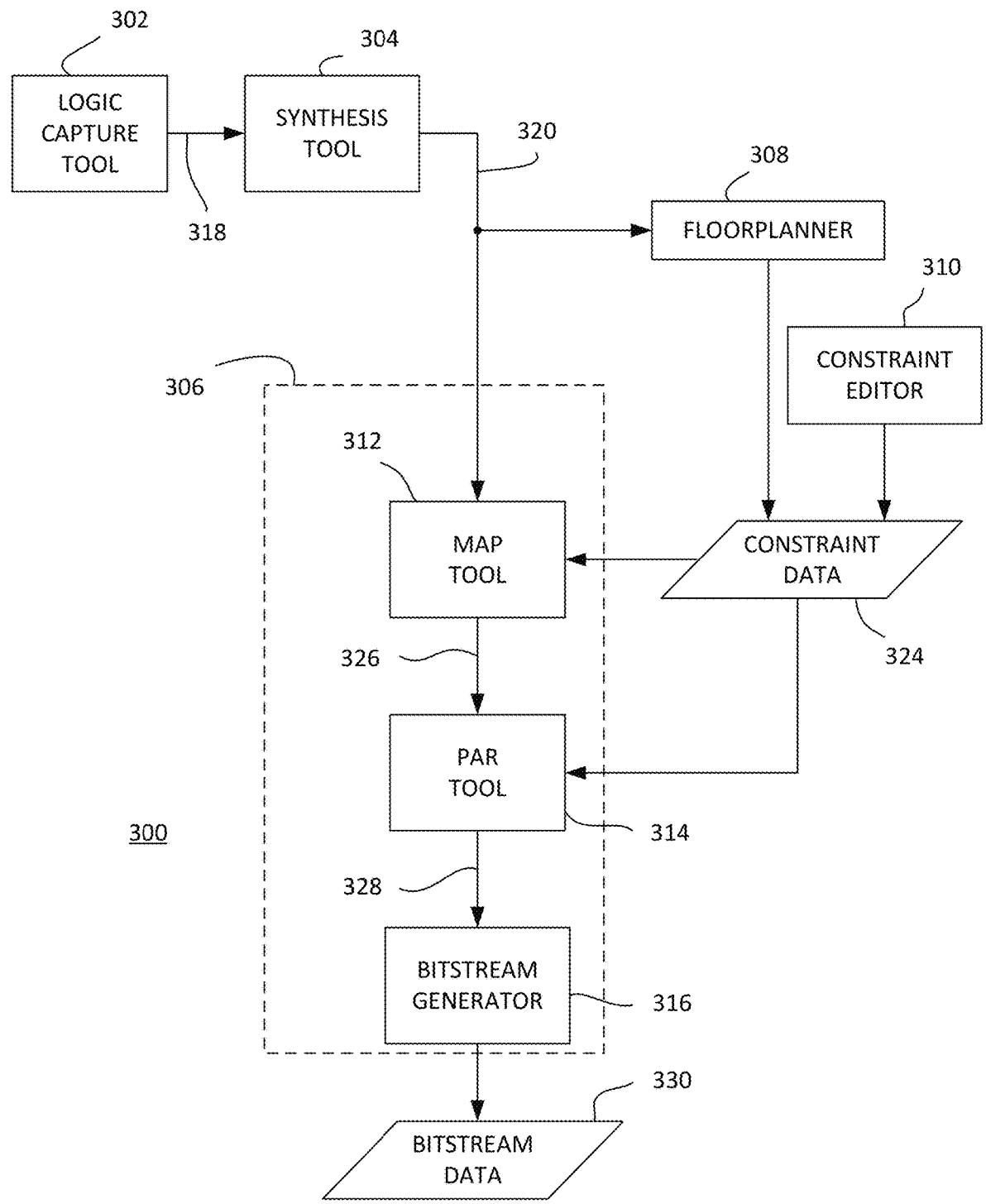
FIG. 3 is a block diagram depicting an illustrative example of a logic design system for a programmable logic device (PLD) in accordance with one or more aspects of the present disclosure.

A design tool for providing dynamic partial reconfiguration of a circuit design is described. Aspects of the present disclosure may be understood with reference to the following illustrative FPGA and CLB architectures described in FIGS. 1 and 2. Although these architectures are provided by way of example, those skilled in the art will appreciate that the present disclosure may be used with other types of PLD and configurable logic block structures or other circuit structures.

FIG. 1 illustrates an FPGA architecture 100 that includes a large number of different programmable tiles including multi-gigabit transceivers (MGTs 101), configurable logic blocks (CLBs 102), block random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A CLE may also be referred to as a "slice" of the CLB. Each CLB slice in turn includes various circuits, such as flip-flops, function generators (e.g., a look-up tables (LUTs)), logic gates, memory, and like type well-known circuits. A BRAM 103 can include a BRAM logic element (BRL 113) in addition to one or more programmable interconnect elements. Typically, the number of interconnect elements included in a tile depends on the height of the tile. In the pictured example, a BRAM tile has the same height as four CLBs, but other numbers (e.g., five) can also be used. A DSP tile 106 can include a DSP logic element (DSPL 114) in addition to an appropriate number of programmable interconnect elements. An IOB tile 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The example FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx® of San Jose, Calif., may be employed. The processor block 110 is coupled to the programmable logic of the FPGA.

In the pictured example a columnar area near the center of the die (shown shaded in FIG. 1) is used for configuration, clock, and other control logic. Horizontal areas 109 extending from this column are used to distribute the clocks and configuration signals across the breadth of the FPGA. Configuration information for the programmable logic is stored in configuration memory (not shown). The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. A detailed description of a partial reconfiguration process for the FPGA is provided below.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an illustrative FPGA architecture. The number of logic blocks in a column, the relative widths of the columns, the number and order of columns, the types of logic blocks included in the columns, the relative sizes of the logic blocks, and the interconnect/logic implementations included at the top of FIG. 1 are purely illustrative. For example, in an actual FPGA more than one adjacent column of CLBs is typically included wherever the CLBs appear, to facilitate the efficient implementation of user logic.

FIG. 2 is an illustrative block diagram depicting an illustrative example of an FPGA partial reconfiguration architecture for an FPGA device 200. In one example, an FPGA device may be represented as a 2-D array of programmable units 210 as illustrated in FIG. 2. For example, there are two types of resources within each programmable unit 210, one type is for logic function placement 204 (e.g., a unit for logic function placement as illustrated with the letter "P"); the other type of resource is for logic connection routing 202 (e.g., a unit for logic connection routing as illustrated with the letter "R"). These two types of resources 202 and 204 are tightly coupled, e.g., having closest physical connection and strong logic dependency. In one example, each programmable unit 210 is logically illustrated as comprising two (2) units for logic function placement 204 and one (1) unit for logic connection routing 202.

In turn, a reconfigurable module region 220 uniquely specifies a set of programmable units 210 for reconfigurable module logic placement and routing. For partial reconfiguration, it is generally required that the implementation of logic must only use placement 204 and routing 202 resources within the defined reconfigurable module region. In other words, programmable units 210 in the region(s) outside of the reconfigurable module region 220 as shown in FIG. 2 cannot be used by the reconfigurable module region 220. For example, the region(s) outside of the reconfigurable module region 220 may comprise one or more regions reserved for static logic. More specifically, generally the FPGA implementation flow does not allow static logic to be placed within a reconfigurable module region. Furthermore, the reconfigurable module region 220 is not allowed to use routing resources within the region reserved for the static logic. It should be noted that the underlying hardware supports the reprogramming of a reconfigurable module region without impacting the static routing connections.

FIG. 3 is a block diagram depicting an illustrative example of a logic design system 300 for a programmable logic device (PLD) in accordance with one or more aspects of the present disclosure. The system 300 includes a logic capture tool 302, a synthesis tool 304, a floorplanner 308, a constraint editor 310, and an implementation tool 306. In the present example, the system 300 is configured to implement a logic design using a target FPGA. Accordingly, the implementation tool 306 includes a map tool 312, a place-and-route (PAR) tool 314, and a bitstream generator 316. The system 300 may be implemented using the computer 700 of FIG. 7 and described below. Notably, the tools may be part of one or more software programs stored in a memory and configured for execution by a central processing unit (CPU).

One or more aspects of the present disclosure relate to creating dynamically reconfigurable modules for use in an FPGA ("modular design"). For example, the logic design is divided into a top-level design having modules. Each of the modules is either a static logic module or a reconfigurable module. A reconfigurable module is capable of partial dynamic active reconfiguration when the target FPGA is active via a partial reconfiguration process. In one example, the reconfigurable module is expanded through a partial reconfiguration flow that allows for the reconfigurable module to use routing resources that are external to the physical region of the reconfigurable module.

The present disclosure describes a method that utilizes different regions for routing from regions that are used for placement purposes for each reconfigurable module. For example, one region (broadly a first region) is used exclusively for placement of reconfigurable module logic, i.e., units for logic function placement are limited to this first region. In contrast, another region (broadly a second region), which is larger, is used for routing of the reconfigurable module logic. In one example, the second region encompasses the first region as discussed below. The method of the present disclosure allows reconfigurable module logic to use routing resources in programmable units originally reserved exclusively for static logic.

FIG. 4 is again an illustrative block diagram depicting an illustrative example of an FPGA device 400 that is used to illustrate the routing problems as discussed above. More specifically, routing congestions tend to manifest along the boundaries 420 and especially at the corners of a reconfigurable module region 410, due to the reduction of adjacent routing resources. Although only one boundary 420 is identified in FIG. 4, it should be noted that the reconfigurable module region 410 has many boundaries and corners which are not identified with a reference numeral to improve clarify of the drawing. This may result in a design failing to route certain nets and/or failing to meet timing requirements. Similarly, gap(s) 430 in physical regions of a given reconfigurable module may also pose challenges in routing since reconfigurable module logic are restricted to use routing resources only in the specified but "disjointed" regions of the reconfigurable module. It should be noted that the term "disjointed" does not mean that the physical regions of a given reconfigurable module are not connected or contiguous, but instead indicates that the gap(s) 430 will cause a much longer routing path to be used than if the gap(s) 430 did not exist. Again, undesired results may result, e.g., nets do not route efficiently, clock skew, and/or nets do not meet timing requirements.

The present method provides an opportunity to solve the above mentioned routing problems. For example, the present method provides improvements in design routability and quality of result (QoR) for FPGA devices. For a modular design, the illustrative logic design system 300 is used to separately implement the modules and then the top-level design, as described more fully below. For purposes of clarity by example, the logic design system 300 is described below with respect to a logic design in general. Features of the design system 300 specifically pertaining to modular design are described along with FIG. 5.

In particular, the logic capture tool 302 is configured to capture or receive a circuit design from a user, e.g., via a user interface and generate a behavioral description 318 of the circuit design. The behavioral description 318 may include a plurality of circuit components, such as flip-flops, memories, LUTs, and the like, connected together via signal conductors (nets). The logic capture tool 302 may include a graphic interface through which a designer connects symbols and blocks representing various components to produce a schematic description of the circuit design. The logic capture tool 302 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 304 is configured to receive the behavioral description 318. The synthesis tool 304 processes the behavioral description 318 to produce a logical description 320 of the circuit design. The logical description 320 includes a logical network list ("netlist") of lower-level circuit elements and logic gates, as well as connections (nets) between inputs and outputs thereof, in terms of the hierarchy specified in the behavioral description 318. For example, the logical description 320 may be compliant with the Electronic Design Interchange Format (EDIF). The synthesis tool 304 may also generate constraint data associated with the logical description 320 that includes various timing and layout constraints. Alternatively, the logical description 320 may be annotated with constraint data. Such an annotated netlist is produced by XST synthesis tool, commercially availabily by Xilinx, Inc., of San Jose, Calif.

The floorplanner 308 is configured to receive the logical description 320. The floorplanner 308 may comprise a graphical tool that gives a designer control over location of circuit components of a logic design in the target FPGA. In one example, the floorplanner 308 displays a hierarchical representation of the logic design in a window of a graphic interface using hierarchy structure lines and colors to distinguish the different hierarchical levels. The window displays the floorplan of the target FPGA and allows the designer to draw rectangles into which the designer places logic from the hierarchy. The floorplanner 308 generates various constraints that are provided as part of constraint data 324. Such constraints include positions and ranges of logic blocks. A designer may use the constraint editor 310 to add various constraints to the constraint data 324, such as PERIOD constraints (i.e., the time between rising edges of a clock signal) for all clocks, as well as input/output (IO) timing constraints (time between two pins, typically measured from a clock input at a first pin and data out at a second pin) for IOs.

The map tool 312 is configured to receive the logical description 320 and the constraint data 324. The map tool 312 maps the logical description 320 onto physical resources within the target FPGA (i.e., the circuit components, logic gates, and signals are mapped onto LUTs, flip-flops, clock buffers, I/O pads, and the like of the target FPGA). The map tool 312 produces a mapped circuit description 326 in accordance with any constraints in the constraint data 324. The mapped circuit description 326 includes groupings of the physical resources of the target FPGA expressed in terms of CLBs and IOBs that include these resources. The mapped circuit description 326 does not include physical location information.

The PAR tool 314 is configured to receive the mapped circuit description 326 and the constraint data 324. The PAR tool 314 determines placement for the physical resource groupings of the mapped circuit description 326 in the target FPGA and apportions the appropriate routing resources. The PAR tool 314 performs such placement and routing in accordance with any constraints in the constraint data 324. The PAR tool 314 produces physical design data 328. The bitstream generator 316 is configured to receive the physical design data 328 and produce bitstream data 330 for the target FPGA.

Figure 5:
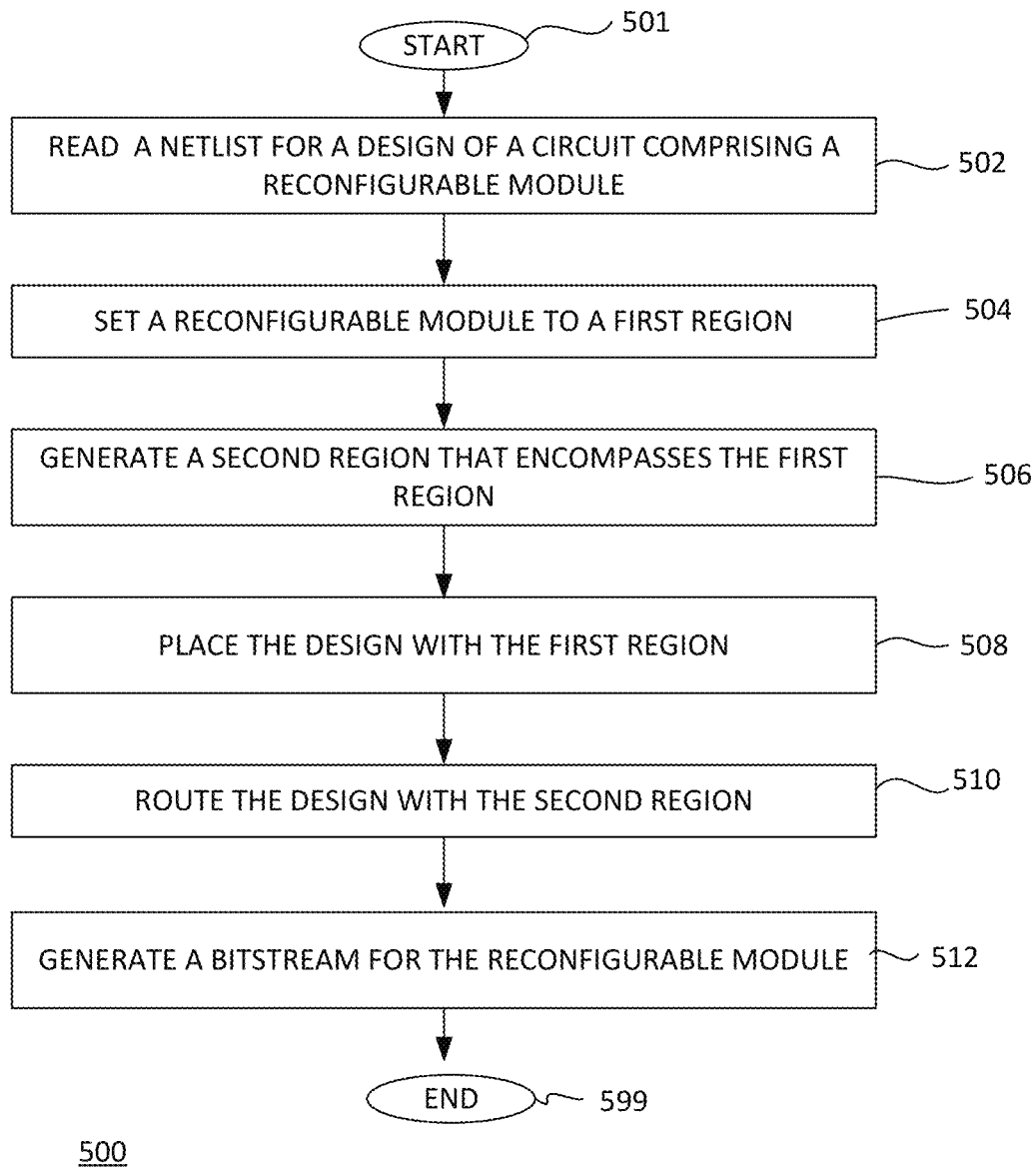
FIG. 5 depict a flow diagram of an illustrative example of a method for providing a partial reconfiguration of a reconfigurable module in accordance with one or more aspects of the present disclosure.
Figure 6:
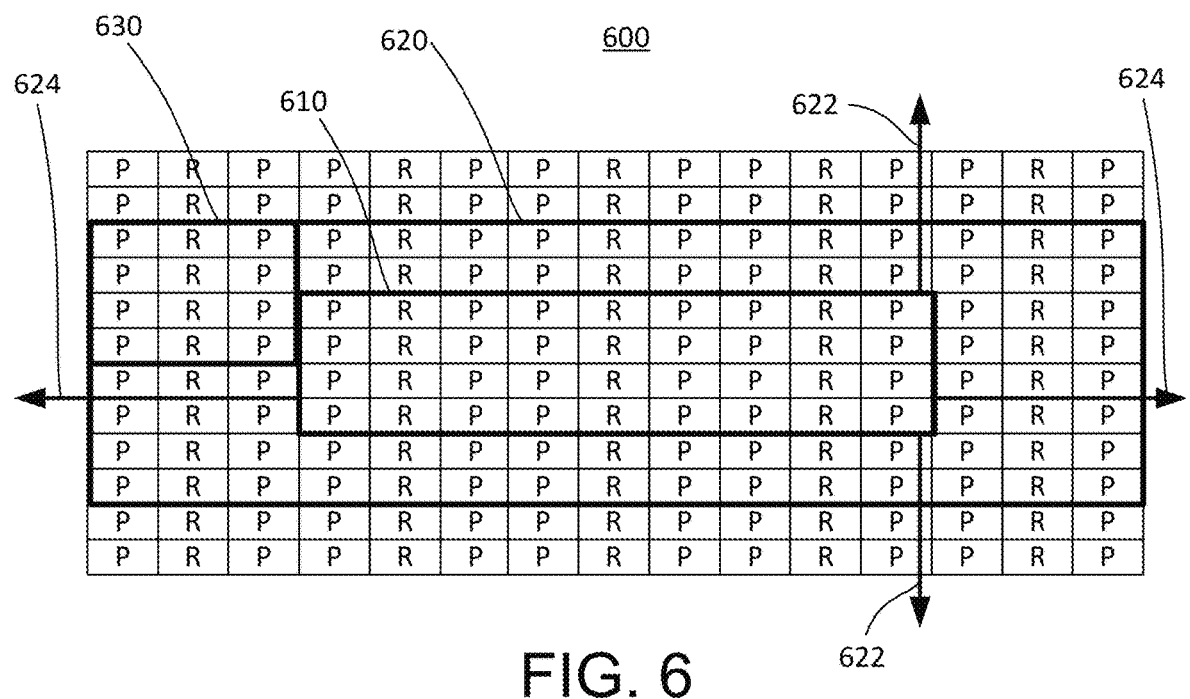
FIG. 6 is an illustrative block diagram depicting another illustrative example of an FPGA partial reconfiguration architecture.

FIG. 5 illustrates a flow diagram of an illustrative example of a method 500 for providing a partial reconfiguration (or broadly a configuration) of a reconfigurable module in accordance with one or more aspects of the present disclosure. In one example, steps, functions and/or operations of the method 500 may be performed by a logic design system 300 as discussed above. In another example, the steps, functions, or operations of method 500 may be performed by a computing device or system 700, and/or processor 701 as described in connection with FIG. 7 below. For instance, computing device or system 700 may represent a logic design system 300 of the present disclosure. For illustrative purposes, the method 500 is described in greater detail below in connection with an example performed by a processor, such as processor 701. FIG. 6 depicts an illustrative example of an FPGA partial reconfiguration architecture with an expanded region. The reader is encouraged to refer to FIG. 6 in conjunction with FIG. 5 to follow the description of method 500.

The method 500 begins at step 501. At step 502, the processor reads a netlist for a design of a circuit comprising a reconfigurable module, e.g., a design for an FPGA. For example, the netlist is read by map tool 312 of FIG. 3 and the netlist is for a design of a circuit comprising one or more reconfigurable modules.

At step 504, the processor sets or specifies a reconfigurable module region (e.g., 610 of FIG. 6) to a physical region of the circuit. For example, the processor accepts and executes a placement command or instruction. The specified first region is the area in which the units for logic function for the reconfigurable module will be placed.

At step 506, the processor generates or specifies a second region that encompasses the first region. Said another way, the processor expands the first region in one or more directions of the circuit to generate the second region. As a result, the second region is larger than the first region.

At step 508, the processor places the design with the first region, e.g., placing the logic functions associated with the reconfigurable module within the first region. The region outside of the first region may receive placement of the static logic and/or the logic functions of another reconfigurable module.

At step 510, the processor routes the design with the second region, e.g., routing the logic functions associated with the reconfigurable module within the second region (e.g., 620 of FIG. 6). In other words, the routing resources of the region outside of the first region may now be used to route the logic functions associated with the reconfigurable module. Said another way, the routing resources of a static logic (e.g., shown as 630 in FIG. 6) that is external to the first region can now be used by the reconfigurable module thereby alleviating the problems as illustrated by FIG. 4 above. In sum, the region specified for reconfigurable module has been expanded with respect to available routing resources that can be used to route the logic functions associated with the reconfigurable module. More specifically, pertaining to steps 512 and 514 the logic design for each static module and reconfigurable module can be placed and routed using the PAR tool 314 of FIG. 3 in accordance with the constraint data of the top-level design and any constraint data for the module design. For example, the PAR tool 314 may route some signals for a reconfigurable module into a static logic implementation area. That is, routing resources in a static logic implementation area are used to route signals for the reconfigurable module.

At step 512, the processor generates a bitstream (broadly a partial bitstream relative to a full bitstream for the entire design of the circuit) for the reconfigurable module. Alternatively, the processor may generate the full bitstream for the entire design of the circuit at this stage.

Although not shown in FIG. 5, if the determination is made that there are more reconfigurable modules to be reconfigured, then various steps of FIG. 5 are repeated until the full design for the full circuit has been configured. In other words, method 500 is described with respect to a single reconfigurable module for clarity reasons. Furthermore, during the final assembly phase (not shown in FIG. 5), physical implementations of the various static logic and reconfigurable modules are combined to produce a complete physical design. In other words, at least one full design implementation file is generated by combining the static logic modules with various reconfigurable modules. The implementations for the modules in the active implementation phase are preserved, where the resultant bitstream(s) are full device programming files. However, one or more partial design implementations may also be produced. The partial design implementations are produced by mapping, placing, routing, and generating a partial bitstream for the top-level design and the various reconfigurable modules using the map tool 312, the PAR tool 314, and the bitstream generator 316 of FIG. 3. The resultant bitstream(s) are partial device programming files and are used to reconfigure or dynamically change the functional behavior of a given reconfigurable module. This reconfiguration of a given reconfigurable module can take place while the rest of the device, as defined in the static logic modules and the reconfigurable modules not being updated, continue to operate in a glitchless manner. By "glitchless" it is meant that executing logic in the static logic modules and the reconfigurable modules not being updated will by unaffected by the programming of values into memory cells during dynamic reconfiguration. The method 500 ends at step 599.

It should be noted that there are many different ways to select the size of the second region. Said another way, there are many different ways to expand the size of the first region in one or more directions on the circuit to arrive at the second region. In one example, the processor in step 506 will fill a horizontal gap, a vertical gap and/or both horizontal and vertical gaps as shown by 430 of FIG. 4. Alternatively, the processor in step 506 may expand the size of the first region in one or more vertical 622 (e.g., up and/or down) and/or horizontal 624 (e.g., left and/or right) directions. More specifically, the processor in step 506 may expand the size of the first region in one or more vertical 622 directions until a region overlap is encountered, e.g., encountering the border of another reconfigurable module. Similarly, the processor in step 506 may expand the size of the first region in one or more horizontal 624 directions until a region overlap is encountered, e.g., encountering the border of another reconfigurable module. Alternatively, the processor in step 506 may also expand the size of the first region in one or more vertical 622 and horizontal 624 directions to a unit of higher order (e.g., a clock region). Alternatively, in one example the processor in step 506 may also expand the size of the first region by receiving manual inputs that define the expanded first region, e.g., a specific size predefined by the user. It should be noted that any number of the above "expansion" methods can be used individually or in combination in step 506 of FIG. 5 discussed above.

Figure 7:
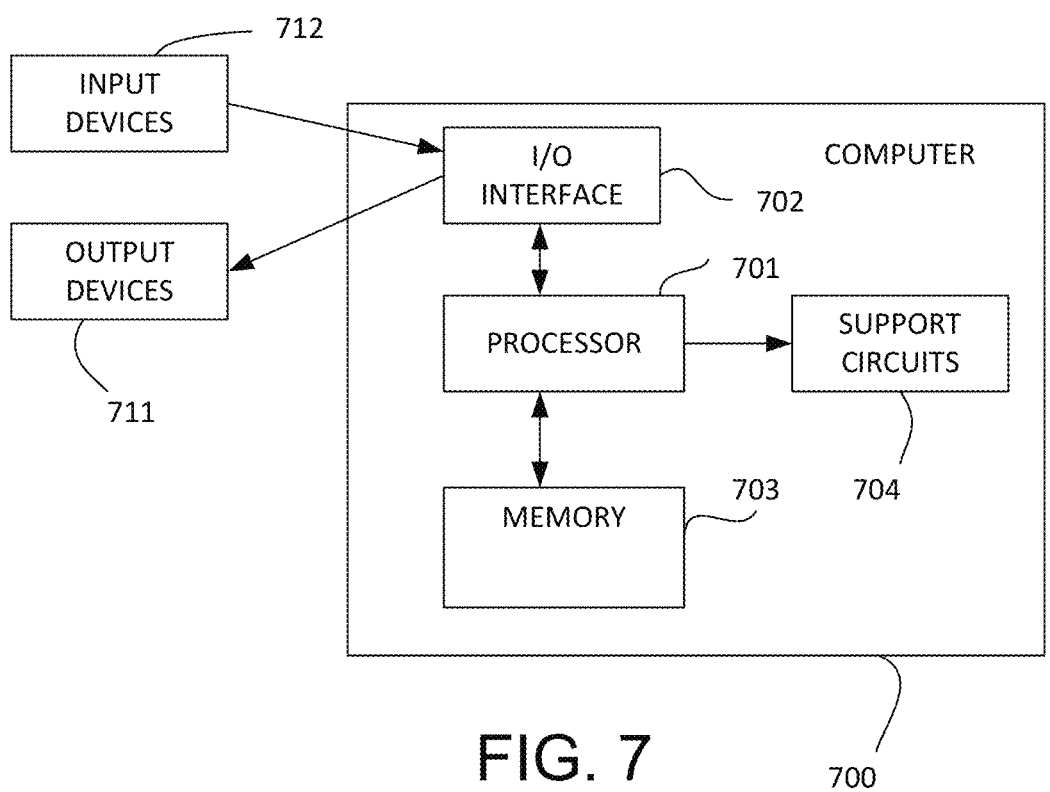
FIG. 7 is a block diagram depicting an illustrative example of a computer suitable for implementing the processes and methods described herein.

FIG. 7 is a block diagram depicting an illustrative example of a computer 700 suitable for implementing the processes and methods described herein. For example, the computer 700 may be used to implement the system 300 of FIG. 3, as well as the method 500 of FIG. 5. The computer 700 includes a processor 701, a memory 703, various support circuits 704, and an I/O interface 702. The processor 701 may be any type of microprocessor known in the art. The support circuits 704 for the processor 701 include conventional cache, power supplies, clock circuits, data registers, I/O interfaces, and the like. The I/O interface 702 may be directly coupled to the memory 703 or coupled through the processor 701. The I/O interface 702 may be coupled to various input devices 712 and output devices 711, such as a conventional keyboard, mouse, printer, display, and the like.

The memory 703 stores all or portions of one or more programs and/or data to implement the system 300 and the method 500 described herein. Although one or more aspects of the present disclosure are disclosed as being implemented as a computer executing a software program, those skilled in the art will appreciate that the present disclosure may be implemented in hardware, software, or a combination of hardware and software. Such implementations may include a number of processors independently executing various programs and dedicated hardware, such as ASICs.

The computer 700 may be programmed with an operating system, which may be OS/2, Java Virtual Machine, Linux, Solaris, Unix, Windows, Windows95, Windows98, Windows NT, and Windows2000, WindowsME, WindowsXP, Windows 7, Windows 8, and Windows 10 among other known platforms. At least a portion of an operating system may be disposed in the memory 703. The memory 703 may include one or more of the following random access memory, read only memory, magneto-resistive read/write memory, optical read/write memory, cache memory, magnetic read/write memory, and the like, as well as signal-bearing media as described below.

It should be noted that the present disclosure can be implemented in software and/or in a combination of software and hardware, e.g., using application specific integrated circuits (ASIC), a programmable gate array (PGA) including a Field PGA, or a state machine deployed on a hardware device, a computing device or any other hardware equivalents, e.g., computer readable instructions pertaining to the method discussed above can be used to configure a hardware processor to perform the steps, functions and/or operations of the above disclosed method 500. In one embodiment, instructions and data for the present method or process 500 (e.g., a software program comprising computer-executable instructions) can be loaded into memory 703 and executed by the processor 701, e.g., a hardware processor, to implement the steps, functions or operations as discussed above in connection with the illustrative method 500. Furthermore, when a hardware processor executes instructions to perform "operations," this could include the hardware processor performing the operations directly and/or facilitating, directing, or cooperating with another hardware device or component (e.g., a co-processor and the like) to perform the operations.

An aspect of the present disclosure is implemented as a program product for use with a computer system. Program(s) of the program product defines functions of examples and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter example specifically includes information downloaded from the Internet and other networks. Such signal-bearing media, when carrying computer-readable instructions that direct functions of the present disclosure, represent examples of the present disclosure.

The processor executing the computer readable or software instructions relating to the above described method can be perceived as a programmed processor or a specialized processor. As such, the present method 500 (including associated data structures) of the present disclosure can be stored on a tangible or physical (broadly "non-transitory") computer-readable storage device or medium, e.g., volatile memory, non-volatile memory, ROM memory, RAM memory, magnetic or optical drive, device or diskette and the like. Furthermore, a "tangible" computer-readable storage device or medium comprises a physical device, a hardware device, or a device that is discernible by the touch. More specifically, the computer-readable storage device may comprise any physical devices that provide the ability to store information such as data and/or instructions to be accessed by a processor or a computing device such as a computer or an application server.

While the foregoing describes illustrative example(s) in accordance with one or more aspects of the present disclosure, other and further example(s) in accordance with the one or more aspects of the present disclosure may be devised without departing from the scope thereof, which is determined by the claim(s) that follow and equivalents thereof. Claim(s) listing steps do not imply any order of the steps. Trademarks are the property of their respective owners.

What is claimed is:
1. A method comprising:
using a processor-based system:
reading a netlist for a design of a circuit comprising a reconfigurable module, the design of the circuit to be implemented on a programmable logic device;
setting the reconfigurable module to a first region corresponding to a first physical region of the programmable logic device, static logic being outside of the first region;
generating a second region corresponding to a second physical region of the programmable logic device, generating the second region comprising modifying the first region, said second region including at least some of said static logic;
placing logic units of the reconfigurable module within the first region;

routing connections of the reconfigurable module within the second region; and generating an electronic partial bitstream based on the placed logic units and routed connections of the reconfigurable module, the electronic partial bitstream being capable of being loaded onto the programmable logic device to implement the reconfigurable module of the design of the circuit on the programmable logic device.

2. The method of claim 1, wherein the routing uses routing resources of the static logic.

3. The method of claim 1, wherein the second region is larger than the first region.

4. The method of claim 1, wherein the generating the second region comprises expanding the first region in a horizontal direction.

5. The method of claim 4, wherein the generating the second region comprises expanding the first region in the horizontal direction until another reconfigurable module is encountered.

6. The method of claim 1, wherein the generating the second region comprises expanding the first region in a vertical direction.

7. The method of claim 6, wherein the generating the second region comprises expanding the first region in the vertical direction until another reconfigurable module is encountered.

8. The method of claim 1, wherein the generating the second region comprises expanding the first region to fill a gap.

9. The method of claim 1, wherein the generating the second region comprises expanding the first region.

10. A system comprising:
a processor; and
a computer-readable medium storing instructions which, when executed by the processor, cause the processor to perform operations, the operations comprising:
reading a netlist for a design of a circuit comprising a reconfigurable module, the design of the circuit to be implemented on a programmable logic device;
setting the reconfigurable module to a first region corresponding to a first physical region of the programmable logic device, static logic being outside of the first region;
generating a second region corresponding to a second physical region of the programmable logic device, generating the second region comprising modifying the first region, said second region including at least some of said static logic;
placing logic units of the reconfigurable module within the first region;
routing connections of the reconfigurable module within the second region; and
generating an electronic partial bitstream based on the placed logic units and routed connections of the reconfigurable module, the electronic partial bitstream being capable of being loaded onto the programmable logic device to implement the reconfigurable module of the design of the circuit on the programmable logic device.

11. The system of claim 10, wherein the routing uses routing resources of the static logic.

12. The system of claim 10, wherein the generating the second region comprises expanding the first region in a horizontal direction.

13. The system of claim 10, wherein the generating the second region comprises expanding the first region in a vertical direction.

14. The system of claim 10, wherein the generating the second region comprises expanding the first region to fill a gap.

15. The system of claim 10, wherein the generating the second region comprises expanding the first region.

16. A non-transitory computer-readable medium storing instructions which, when executed by a processor, cause the processor to perform operations, the operations comprising:
reading a netlist for a design of a circuit comprising a reconfigurable module, the design of the circuit to be implemented on a programmable logic device;
setting the reconfigurable module to a first region corresponding to a first physical region of the programmable logic device, static logic being outside of the first region;
generating a second region corresponding to a second physical region of the programmable logic device, generating the second region comprising modifying the first region, said second region including at least some of said static logic;
placing logic units of the reconfigurable module within the first region;
routing connections of the reconfigurable module within the second region; and
generating an electronic partial bitstream based on the placed logic units and routed connections of the reconfigurable module, the electronic partial bitstream being capable of being loaded onto the programmable logic device to implement the reconfigurable module of the design of the circuit on the programmable logic device.

17. The non-transitory computer-readable medium of claim 16, wherein the routing uses routing resources of the static logic.

18. The non-transitory computer-readable medium of claim 16, wherein the generating the second region comprises expanding the first region in a horizontal direction.

19. The non-transitory computer-readable medium of claim 16, wherein the generating the second region comprises expanding the first region in a vertical direction.

20. The non-transitory computer-readable medium of claim 16, wherein the generating the second region comprises expanding the first region.

* * * * *